US006973606B2

(12) United States Patent
Mukherjee (10) Patent No.: US 6,973,606 B2
(45) Date of Patent: Dec. 6, 2005

(54) PARTIALLY DISTRIBUTED CONTROL MECHANISM FOR SCANOUT INCORPORATING FLEXIBLE DEBUG TRIGGERING

(75) Inventor: Aditya Mukherjee, Belmont, CA (US)

(73) Assignee: Intel Corporation, Santa Clara, CA (US)

( * ) Notice: Subject to any disclaimer, the term of this patent is extended or adjusted under 35 U.S.C. 154(b) by 415 days.

(21) Appl. No.: 09/752,879

(22) Filed: Dec. 28, 2000

(65) Prior Publication Data

US 2002/0040456 A1 Apr. 4, 2002

Related U.S. Application Data

(63) Continuation-in-part of application No. 09/677,392, filed on Sep. 29, 2000.

(51) Int. Cl.[7] .............................................. G01R 31/28
(52) U.S. Cl. ..................... 714/724; 714/27; 714/727; 713/500
(58) Field of Search .............................. 714/30, 34, 25, 714/31, 724–734, 740, 744, 738–739, 27; 716/4, 12–14; 713/400–401, 500–503; 710/305; 365/200–201; 324/765

(56) References Cited

U.S. PATENT DOCUMENTS

| 4,253,183 A | * | 2/1981 | Taylor et al. ................... 714/27 |
| 5,701,308 A | * | 12/1997 | Attaway et al. ............. 714/740 |
| 5,790,561 A | * | 8/1998 | Borden et al. ............... 714/724 |
| 5,951,696 A | * | 9/1999 | Naaseh et al. ................. 714/34 |
| 6,181,151 B1 | * | 1/2001 | Wasson ....................... 324/765 |
| 6,665,816 B1 | * | 12/2003 | Edwards et al. .............. 714/30 |

* cited by examiner

Primary Examiner—Guy J. Lamarre
(74) Attorney, Agent, or Firm—Blakely, Sokoloff, Taylor & Zafman LLP (57) ABSTRACT

The invention includes an integrated circuit (IC). The IC includes an internal test bus (ITB). The IC also includes a number of deskew clusters connected to the ITB. The deskew clusters each include a deskew controller. The IC also includes an integrated test controller (ITC) connected to the ITB. Further, the IC includes a debug unit connected to the ITC. The ITC generates a single global control signal and the deskew controller generates a first local command signal.

20 Claims, 8 Drawing Sheets

| control line/clock | Logic equations / details | Generated from | Driven to |
|---|---|---|---|
| scanout_load (non_critical) | SCANOUTSIG + SCANOUTLOAD + SCANOUTLOADDBG + (ISCAN_BUS + ISCAN_TAP) | De-skew controller | all LBFs |
| scanout_shift (non_critical) | SCANOUTSIG + SCANOUTSHIFT | De-skew controller | all LBFs |
| ck (clock driving scanout ff) | scanout_ctl & qclk | LBF | LBF |
| scanout_ctl | 1. (SCANOUTLOADDBG & Run-test/Idle<br>2. (SCANOUTLOAD & Run-test/Idle & TDI) +<br>3. (SCANOUTSHIFT & (TCK & gclk)*) +<br>4. SCANOUTRST +<br>5. (SCANOUTSIG + Run-test/Idle & dbgsnapshot<br>6. (ISCAN_BUS + ISCAN_TAP) | ITC, staged in De-skew cluster | all LBFs |

PARTIALLY DISTRIBUTED CONTROL MECHANISM FOR SCANOUT INCORPORATING FLEXIBLE DEBUG TRIGGERING

This application is a continuation-in-part of U.S. patent application Ser. No. 09/677,392 filed Sep. 29, 2000.

BACKGROUND OF THE INVENTION

1. Field of the Invention

The invention relates to error detection/correction and fault detection/recovery. More particularly, the invention relates to digital logic testing through a reduction in the number of global test control lines.

2. Background Information

An integrated circuit or "chip" is a microelectronic semiconductor device having many interconnected transistors and other components. Chips may be fabricated on a small rectangle cut from a silicon wafer. The small size of these circuits allows high speed, low power dissipation, and reduced manufacturing cost compared with board-level integration.

The first integrated circuits contained only a few transistors. Small Scale Integration (SSI) brought circuits containing transistors numbered in the tens. Later, Medium Scale Integration (MSI) contained hundreds of transistors and Large Scale Integration (LSI) contained thousands of transistors. At present Very Large Scale Integration (VLSI) circuit chips are composed of hundreds of thousands of logic elements or memory cells. Digital VLSI integrated circuits may contain anything from one to millions of logic gates—inverters, gates, flip-flops, and multiplexors on a few square millimeters.

Part of producing a scaleable VLSI chip includes testing and debugging the chip. Debugging is an attempt to determine the cause of any malfunction symptoms detected by testing. Circuitry may be built into an integrated circuit to assist in the test, maintenance, and support of an assembled circuit. Hardware features, known as design for test (DFT) features or resources, may be incorporated into a chip to aid in testing and debugging.

Determining the cause of a malfunction or other problem may be achieved by using a testing machine to send a simulated signal from a debug pin residing on the perimeter of the chip to a logic element within the chip so as to trigger a response bit (0 or 1) from that logic element. On a clock signal, an instruction may cause a snapshot or "scan" to be taken of this triggered response bit by a DFT feature. On the next clock signal, and as part of that same instruction, the scan information bit may be shifted one bit "out" towards a serial output on the chip to a second perimeter pin so that the scan bit may be compared to an expected response. If this triggered response or "scanout" varies from the expected response, then that particular logic element may be a cause of the noted problem.

Note, to debug a chip, it may be necessary to view a sampled state of hundreds of chip-internal signals within a space of minutes. Conventionally, for example a first debugging technique may be used to isolate a probable bug location from a million transistors to a group of a few hundred transistors. Then, a second debugging technique may be used to rapidly find the exact transistor failure point from the grouped few hundred transistors. Chips may have redundant transistors in them such that, once a transistor failure point is located, the transistor may be turned off as part of chip production while a redundant transistor may then similarly be turned on.

For example, to isolate a probable bug location from a million transistors to a group of a few hundred transistors, an integrated circuit chip may be designed to include internal read-only test points. These test points (or scanout "cells") generally are scattered throughout the integrated circuit chip. When chained together to form a distributed shift register, scanout cells produce parallel data that provides observability of selected nodes during functional testing during normal operation of the chip.

U.S. Pat. No. 5,253,255 teaches a centralized control mechanism that employs two global test control lines for each design for test (DFT) feature. According to the patent, sequentially activating the snapshot and the shift with signals requires two global speed critical signals that require close timing tolerances between the two signals.

BRIEF DESCRIPTION OF THE DRAWINGS

The invention is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION OF THE INVENTION

Figure 1:
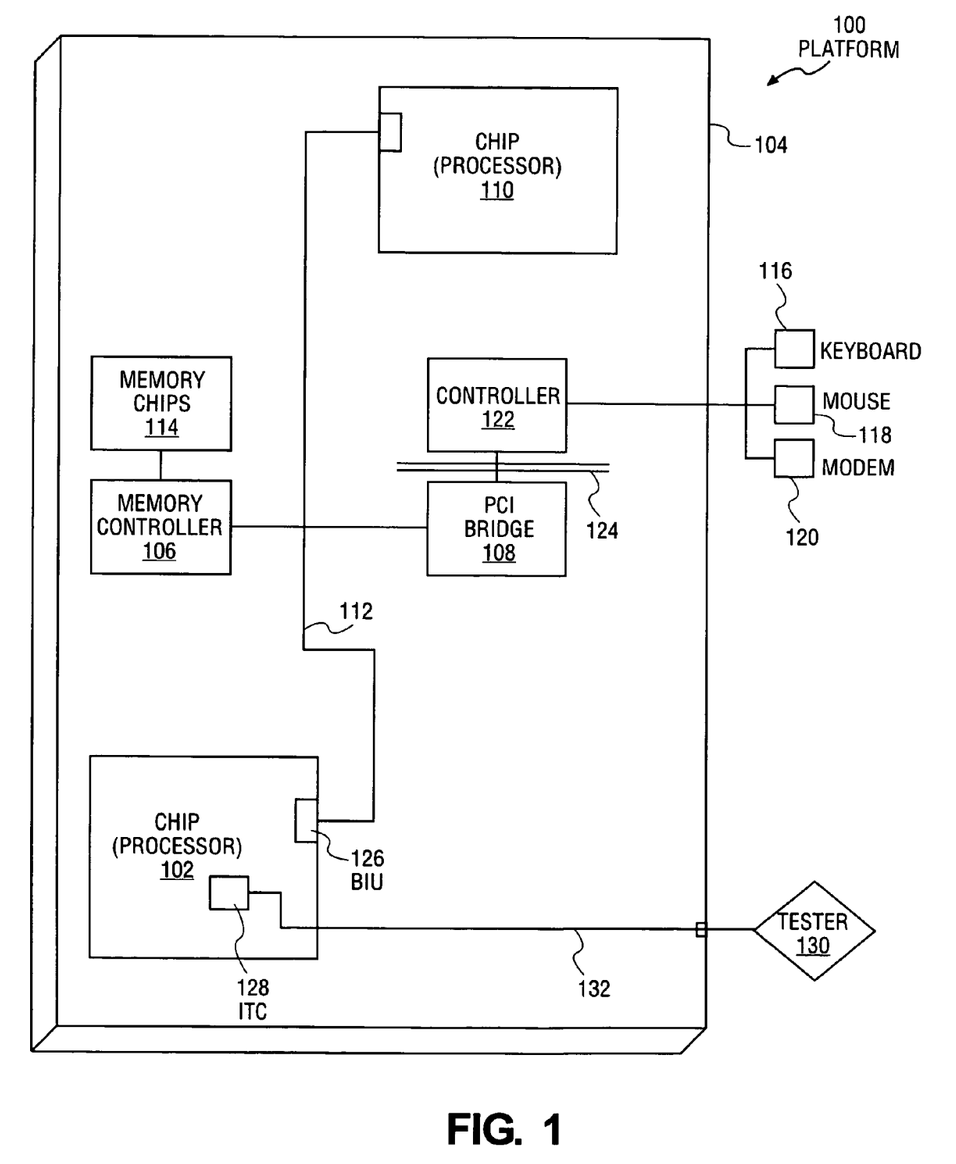
FIG. 1 illustrates platform 100 of an embodiment of the invention having chip 102 disposed on support structure 104.

FIG. 1 illustrates platform 100 of the invention having chip 102 disposed on support structure 104. Platform 100 may be any structure having electronic components, such as chip 102. For example, platform 100 may be a computer or computer system. Moreover, platform 100 may be a printed circuit board (PCB). By way of background, a computer or other electronic system might be built from several PCBs, such as processor, memory, graphics controller, and disk controller PCBs. These boards might all plug into a motherboard or backplane or be connected by a ribbon cable.

Chip 102 may be referred to as a processor or integrated circuit and may be thought of as a microelectronic semiconductor device having many interconnected transistors and other components. Platform 100 may also include memory controller 106, Peripheral Component Interconnect (PCI) bridge 108, and chip 110, each communicatively coupled through processor bus 112.

Memory controller 106 may be coupled to memory chips 114. A controller may be thought of as that part of platform 100 that allows platform 100 to use certain kinds of devices.

Thus, memory controller 106 may be thought of as that part of platform 100 that allows platform 100 to use memory chips 114. Memory chips 114 may be any device that can hold data in machine-readable format.

PCI is a standard to connect external or peripheral devices to a personal computer. The PCI standard entitled PCI to PCI Bridge Architecture Specification (Rev. 1.1, PCI Special Interest Group, Portland, Oreg., 1998) may be implemented in a mezzanine or a bridge, such as PCI bridge 108. Here, PCI bridge 108 may include buffers to decouple chip 102 from relatively slow peripherals and to allow the peripherals to operate asynchronously. PCI bridge 108 may be coupled to external devices through controller 122 over PCI bus 124. These external devices may be input devices such as keyboard 116, mouse 118, and modem 120.

Chip 110 may be an integrated circuit that is similar to chip 102. Chip 102 may include bus interface unit (BIU) 126 and test controller 128. BIU 126 may operate as an input/output port to communicate signals between processor bus 112 and chip 102. Test controller 128 may be any device that asserts test instructions to design for test (DFT) features, where DFT may be design and hardware features incorporated into chip 102 to aid in manufacturing and debugging.

Also coupled to platform 100 may be tester 130. Tester 130 may be a VLSI tester that communicates test instructions to test controller 128 over bus 132. Bus 132 may be thought of as a test and maintenance bus used as part of the interface design to access chip 102. Institute of Electrical and Electronics Engineers (IEEE) standard 1149.1, entitled Test Access Port and Boundary-Scan Architecture, is an internationally recognized design standard specifying product design and test protocols. Particularly, IEEE 1149.1 specifies that the interface design may access a chip for testing purposes. In one embodiment, bus 132 meets the five-pin requirement of IEEE standard 1149.1. Moreover, under IEEE 1149.1, a test access port (TAP) may be an example of test controller 128.

Figure 2:
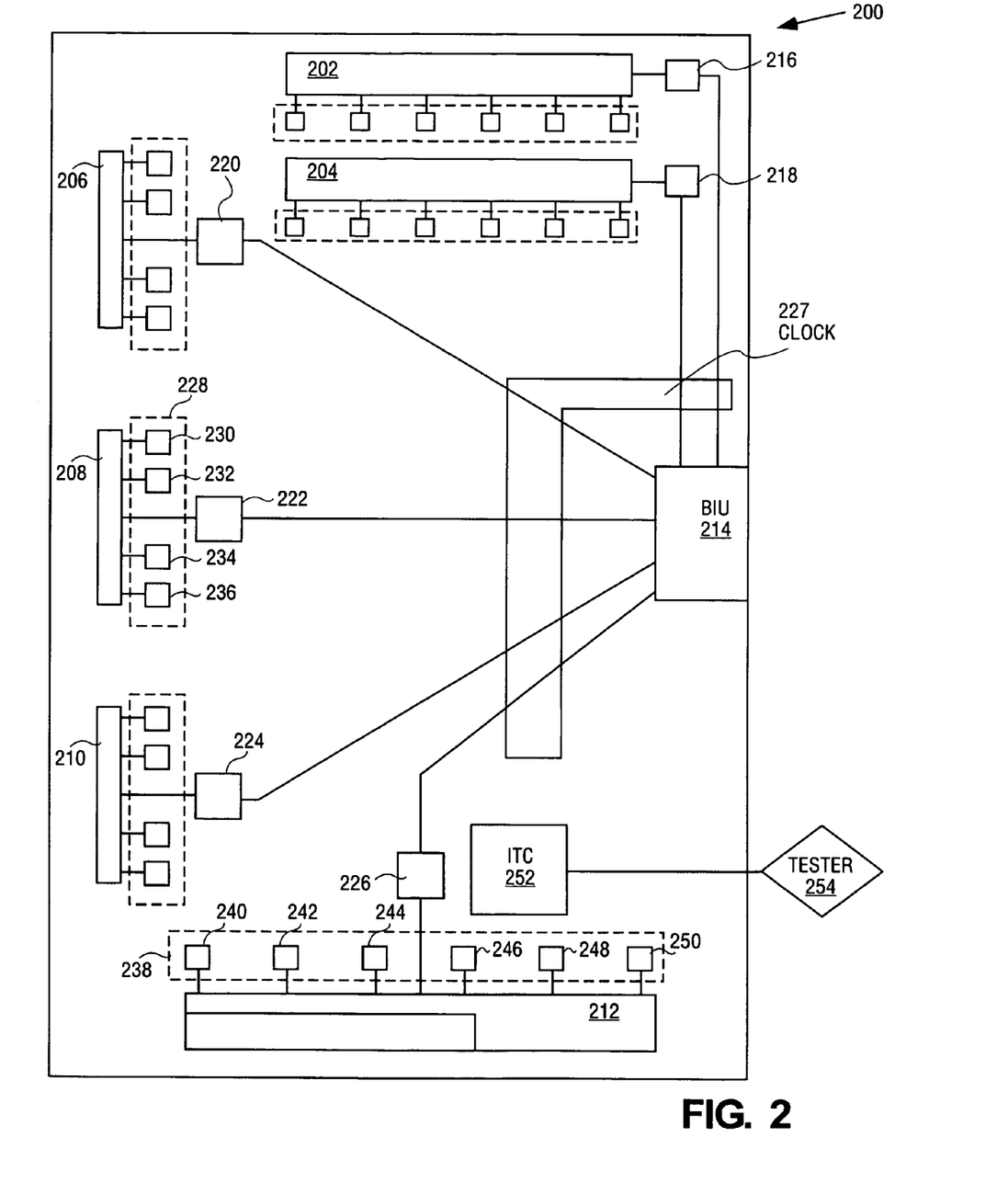
FIG. 2 illustrates chip 200.

FIG. 2 illustrates chip 200. Chip 200 may include logic units 202, 204, 206, 208, 210, and 212, each of which may deal with basic operations of a computer system. For example, logic unit 202 may be a floating point unit (FPU), logic unit 204 may be an arithmetic logic unit (ALU), and logic 212 may be a memory logic. Each logic unit may be coupled to bus interface unit 214 through logic unit controllers 216, 218, 220, 222, 224, and 226 as shown. These controllers local to the logic units of chip 200 may be positioned very close to their respective logic unit. Moreover, bus interface unit (BIU) 214 may be similar to BIU 126 of FIG. 1.

Clock generator 227 may be a core clock generator that is connected between each logic unit controller and BIU 214. Clock generator 227 may produce a signal that may be distributed over clock lines within chip 200 in a tree like structure to the logic units 202, 204, 206, 208, 210, and 212. Each clock signal of a given clock pulse may need to reach its destination within a timing window for events within chip 200 to be synchronized. Timing skew may be though of as the variation between the arrival moment of a first signal as compared to the arrival moment of one or more other signals at the same or different logic unit. Controllers may be placed within chip 200 to control this timing skew. These deskew (DS) controllers, for example, may include a whole host of logic elements that aid in receiving, processing, and retransmitting signals such as clock signals and data instructions to the logic units so as to synchronize the arrival of all instructions to their associated logic unit. In other words, DS controllers may aid in minimizing any timing skew between the signals. Logic unit controllers 216, 218, 220, 222, 224, and 226 may be DS controllers. As will be discussed below, an embodiment of the invention takes advantage of logic unit controllers 216–226 to receive, process, and retransmit testing signals to reduce the number of global test control lines.

Part of producing a working chip includes testing and debugging that chip. Debugging is an attempt to determine the cause of any malfunction symptoms detected by testing. Circuitry may be built into an integrated circuit to assist in the test, maintenance, and support of an assembled circuit. Hardware features, known as design for test (DFT) features, may be incorporated into a chip to aid in testing and debugging.

Each logic unit within chip 200 may be coupled to cells chained together to form a register. For example, logic 208 may be coupled to register 228 having cells 230, 232, 234, and 236. Logic 212 may be coupled to register 238 having cells 240, 242, 244, 246, 248, and 250. Cells 230–236 and 240–250 may be examples of DFT features.

In one embodiment of the invention, chip 200 may include test controller 252 and tester 254. Test controller 252 may be viewed as an integrated test controller when residing within chip 200. Included within test controller 252 may be an instruction register (IR) and a test access port finite state machine (TAP FSM) as described in IEEE 1149.1. Test controller 252 and tester 254 may be similar to test controller 128 and tester 130 of FIG. 1, respectively.

Figure 3:
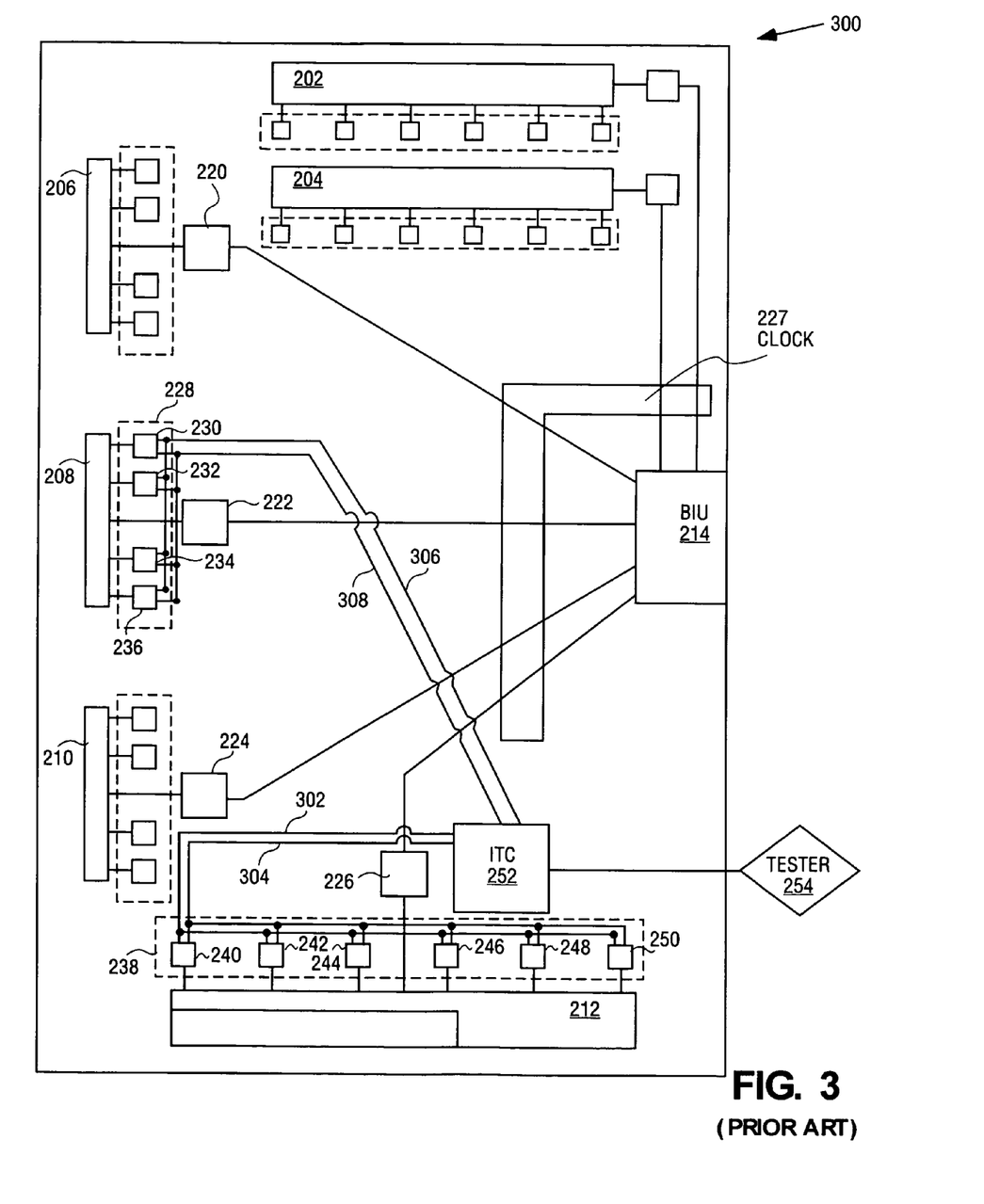
FIG. 3 illustrates chip 300 as a conventional modification of chip 200 of FIG. 2.

FIG. 3 illustrates chip 300. Chip 300 may be a conventional modification of chip 200 of FIG. 2. Conventionally, one global test control line is required to run between test controller 252 and a DFT feature for each type of instruction signal. For example, to transmit a load signal and a test signal from integrated test controller (ITC) 252 and register 238 of FIG. 3, chip 300 may employ global test control lines 302 and 304, respectively. In a similar way, lines 306 and 308 may run between ITC 252 and register 228. In other words, for a scanout process, each DFT feature conventionally may employ two global test control lines. For a different type of testing process, each design for test Feature conventionally may employ three, four, five or more global test control lines.

Conventionally, chips may include, for example, fifty to one hundred global test control lines to transmit information to anywhere from 5,200 DFT features to 49,000 DFT features. These global test control lines may limit chip designers in the placement and arrangement of the control lines and logical units on chip 300 by taking up valuable space on chip 300. More restrictively, the timing of the signals distributed by each of these global test control lines is critical. As noted below, the invention may reduce the number of global test control lines to nineteen (for example, one bus having nineteen lines) to transmit that same information to the design for test features of a chip.

Figure 4:
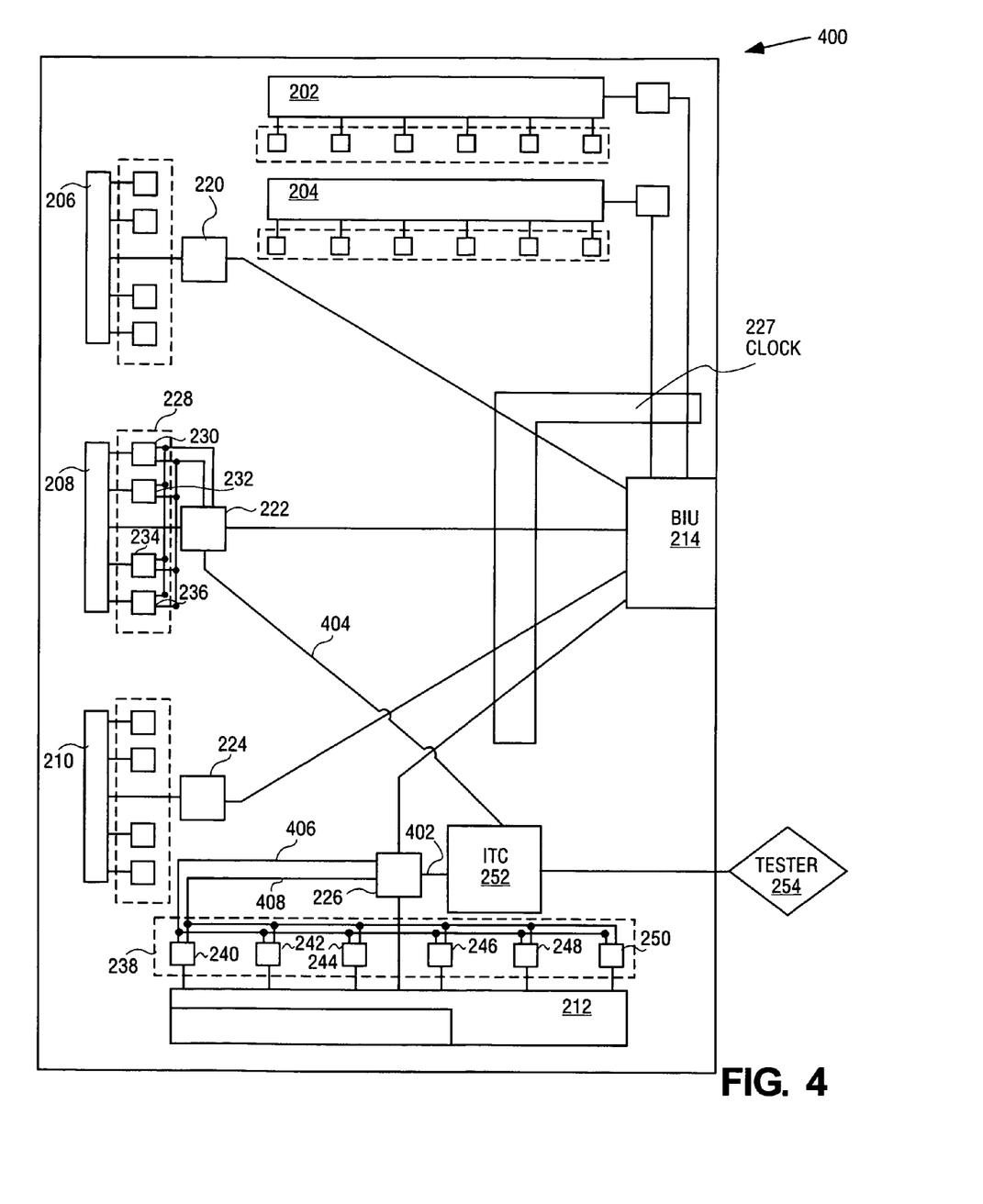
FIG. 4 illustrates chip 400 of an embodiment of the invention

In one embodiment, FIG. 4 illustrates chip 400 of the invention. As can be readily seen, chip 400 may be a modification of chip 200 of FIG. 2. Included with chip 400 may be internal test bus 402 (global control line) disposed between ITC 252 and logic unit controller 226 and internal test bus 404 disposed between ITC 252 and DS controller 222. Chip 400 may also include additional internal test buses (not shown) disposed between ITC 252 and each logic unit controller within chip 400.

Each internal test bus (ITB) of chip 400 may pass test instruction signals as a test instruction packet from ITC 252 to a logic unit controller. Although the bits of these signals may travel over different lines, these different lines may be within a single internal test bus having a single routing path between ITC 252 and a logic unit controller. Moreover, these test instruction signals may travel according to a clock that is internal to tester 254 rather than the core clock that is internal to chip 400, here clock 227. For these and other reasons, timing is not critical with respect to signals routed within an internal test bus in one embodiment of the invention.

To transmit a test information packet in parallel, each internal test bus of chip 400 may include n number of lines such that $$n = a + \log_2 i \quad (500)$$

where
n=number of lines,
a=number of ancillary transmission bits, and
$\log_2 i$=number of instruction bits.

Ancillary transmission bits may be those supporting bits that may be needed to accompany the instruction bits. For a given distributed test control architecture compliant with IEEE 1149.1, the number of ancillary transmission bits may be a constant. The number of instruction bits ($\log_2 i$) may be thought of as a bit stream of zeros and ones. Moreover, the number of instruction bits ($\log_2 i$) may represent the number of unique testing tasks that are desired to be performed within the collective of logic unit controllers (e.g., 222 and 226) of chip 400. For example, where the number of instruction bits equals eight ($8 = \log_2 256$), the test instruction packet may include up to two hundred and fifty six (256) unique testing task signals. The instruction bits may be disposed within an IEEE 1149.1 complaint instruction register.

In one embodiment, the information transmitted over internal test bus 402 may include a shift signal and a load signal. In another embodiment, the information transmitted over internal test bus 402 may be a clock signal and the following five components representing eighteen bits:

(i) instruction register contents (8 bits);
(ii) partially encoded, relevant states of a test access port finite state machine (TAP FSM) (4 bits);
(iii) security-bit (1 bit);
(iv) test data input (TDI) (1 bit); and
(v) counter value from a Wave Shaper (4 bits).

Component (i) may be thought of the number of instruction bits ($\log_2 i$) and components (ii), (iii), (iv), and (v) may be thought of as ancillary transmission bits (a). Accordingly, from equation 500 above, $$19 = (1 + 4 + 1 + 1 + 4) + \log_2 256 \quad (500).$$

These nineteen bits of information may travel as a test information packet. Where the test information instruction packet is encoded, the logic unit controller may include components that decode the test instruction packet.

Not all the states of the test access port finite state machine (TAP FSM) need be transmitted over a test bus (402, 404) of chip 400. This may be true where the state in question is not relevant to control DFT logic internal to chip 400. In one embodiment, the relevant states of TAP FSM under IEEE 1149.1 include the following six states: testlogic-reset (tlr), run-test/idle (rti), capture-down register (capDR), shift-DR (shiftDR), update-DR (updtDR), and dead (the remaining eleven states). Accordingly, in one embodiment of the invention, a subset of all the states of a test access port finite state machine are encoded into three bits. In another embodiment, individual bits may be allocated for test-logic-reset (tlr) and run-test/idle (rti) and the residual (remainder) states (capDR, shiftDR, updtDR, and dead) are allocated among two bits.

On receiving a test instruction packet, a logic unit controller may locally generate whatever testing signals are needed for the desired testing operation. For example, on receiving a test instruction packet having a shift signal and a load signal, logic unit controller 226 may process the test instruction packet to locally generate a shift signal and a load signal. Logic unit controller 226 may then pass these two signals to register 238 over the relatively short distance of distributed test line 406 and distributed test line 408, respectively.

Under the conventional method of FIG. 3, a shift signal and a load signal each travel separately over its own global test control line between the ITC 252 and register 238. The independent travel of these and other test signals over a relatively great distance requires tight or critical control over the timing of these signals. In contrast, one embodiment of the invention transmits these signals together as an instruction bundle or packet between the ITC 252 and logic unit controller 226 so as to eliminate the number of global test control lines and the requirement for critical timing.

One embodiment of the invention may be employed as a method to control at least one DFT feature, such as register 238 of FIG. 4. A test information packet may first be generated in a test controller of an integrated circuit. The test information packet may then be transmitted to at least one logic unit controller over a test bus coupled between the test controller and the at least one logic unit controller. The test information packet may then be processed within the at least one logic unit controller to generate at least one test control signal. The at least one test control signal may be transmitted to the at least one DFT feature coupled to the logic unit controller. A logic unit coupled to the at least one DFT feature may be interacted with based on the at least one test control signal.

In another embodiment, a single speed critical global control signal and two locally generated control signals are used for debug and testability. The two local control signals are generated by local controllers, and are not speed critical. Therefore, a partially-distributed control scheme is formed. This is due to having two signals that are local (distributed control), and one signal that is global. As was presented above, conventionally two global signals are used for debug and testability.

Since a snapshot and shift instruction are conventionally handled as part of a single instruction, the timing of the two global control signals conventionally is very time critical and a close timing tolerance is necessary. In contrast, in one embodiment the snapshot and shift instructions are partitioned into separate operations. Therefore, a snapshot can be performed and the results can be shifted out after a period of time. Also, trigger mechanisms are implemented that improve debugability on an integrated circuit.

Figure 5:
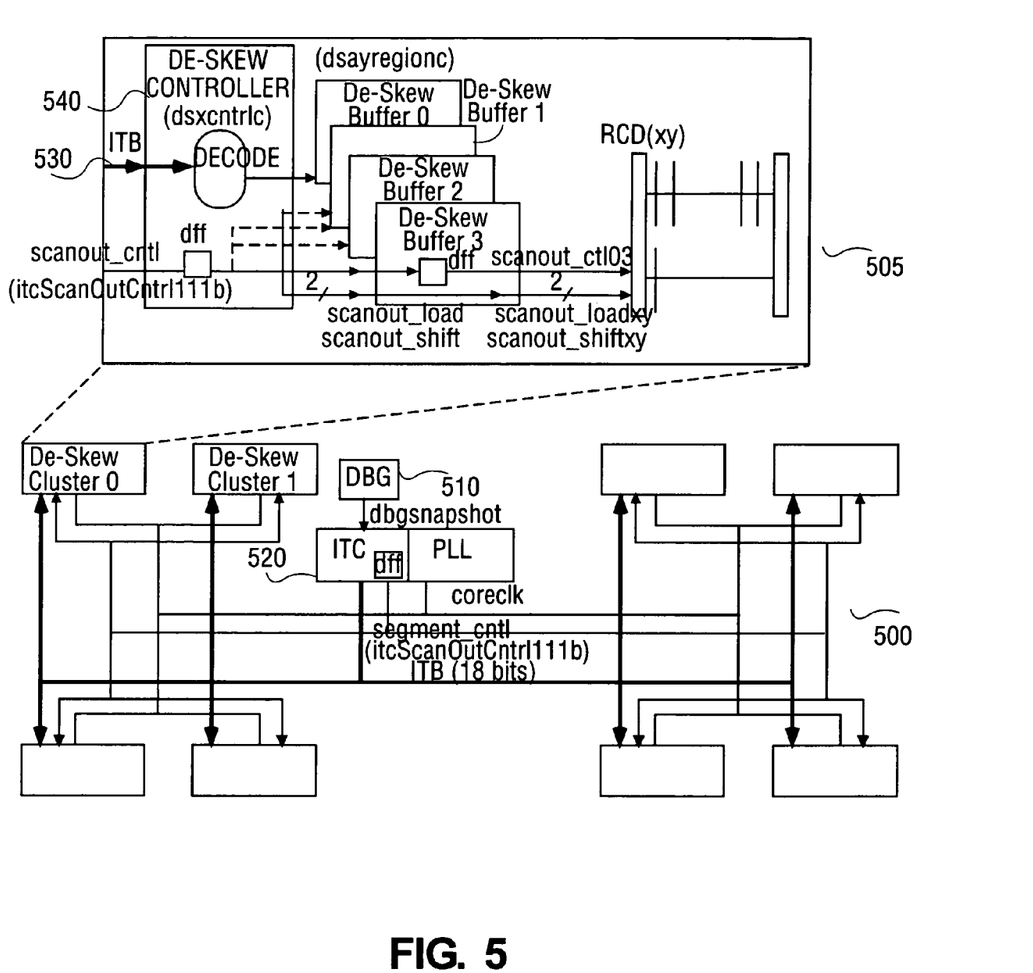
FIG. 5 illustrates a global and local view of scanout control in an embodiment of the invention.

FIG. 5 illustrates global view 500 and local view 505 of scanout control. Also illustrated in FIG. 5 is debug unit (DBG) 510, ITC 520, ITB 530, and DS controller 540. Conventionally, five (5) scanout signals are defined as follows: SCANOUTRST, SCANOUTLOAD, SCANOUTLOADDBG, SCANOUTSHIFT and SCANOUTSIG. It should be mentioned that SCANOUTLOAD instructions are used for a snapshot.

SCANOUTRST resets the scanout chain by setting both load and shift controls to 0. SCANOUTLOADDBG switches scanout cells to load mode and then waits for trigger from the DBG unit 510 illustrated in FIG. 5. SCANOUTLOAD switches scanout cells to load mode and a snapshot occurs in Runtest/Idle on a low-to-high transition of TDI. SCANOUTSHIFT switches scanout cells to shift mode and shifts captured data in shift-DR (data register) operation sequence. SCANOUTSIG sets both load and shift controls of scanout cells to 1 and then enables the clock to scanout cells. The TAP controller then enters a Run-test/Idle state and waits until a debug trigger enabled by (functional) code.

Figure 6:
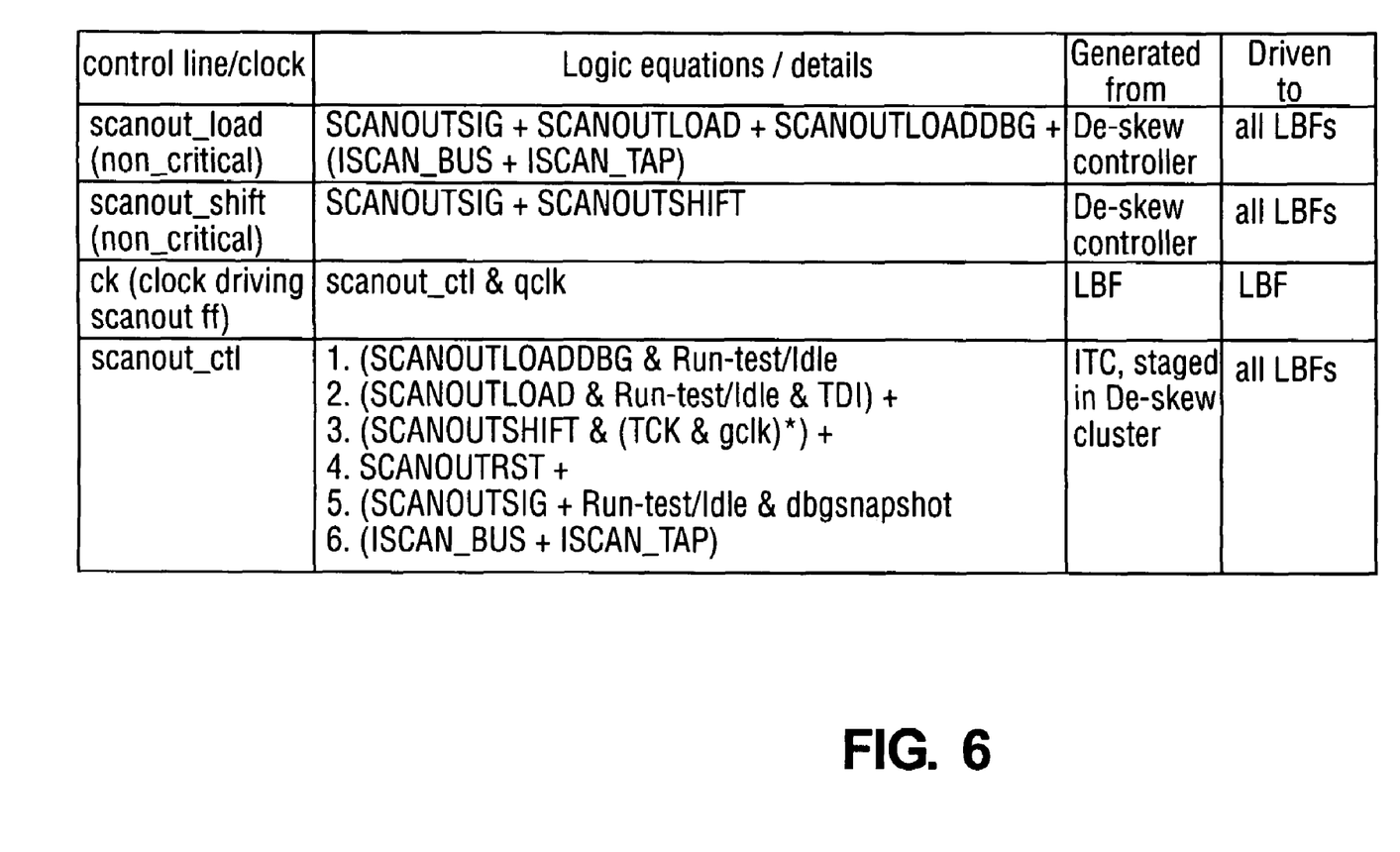
FIG. 6 illustrates logic equations and details of control line signals of an embodiment of the invention.

FIG. 6 illustrates logic equations and details of control line signals scanout_load, scanout_shift, ck, and scanout_ctl. Both scanout_load and scanout_shift signals are generated locally by decoding the corresponding instructions in the DS controllers and distributing to the regional clock drivers (RCD). Both signals have relaxed timing constraints since one global signal, scanout_cntl, is used. The one global scanout_cntl signal is generated in the ITC and is routed as a critical signal (staged in the ITC and the DS controllers) to all the DS controllers. The scanout_cntl signal gates qclk (queue clock) in lbfs (last buffer first serve) that contain scanout cells to generate scanout_clk to the scanout cells. The scanout_cntl signal is a function of the scanout instructions, the TAP FSM state, input from the debug unit (dbgsnapshot when SCANOUTLOAD is used), rising transition on TDI (when SCANOUTLOADDBG is used) and TCK (test clock) (for SCANOUTSHIFT).

When SCANOUTLOADDBG is loaded, the trigger input is provided on a debug pin (DP). The debug unit (DBG) is programmable to respond to the trigger input after a variable latency. The DBG triggers a signal (dbgsnapshot) that is an input to the ITC. The ITC in turn triggers the scanout_cntl signal, which causes a snapshot. This feature, programmable debug, is very powerful for debugging purposes.

Figure 7:
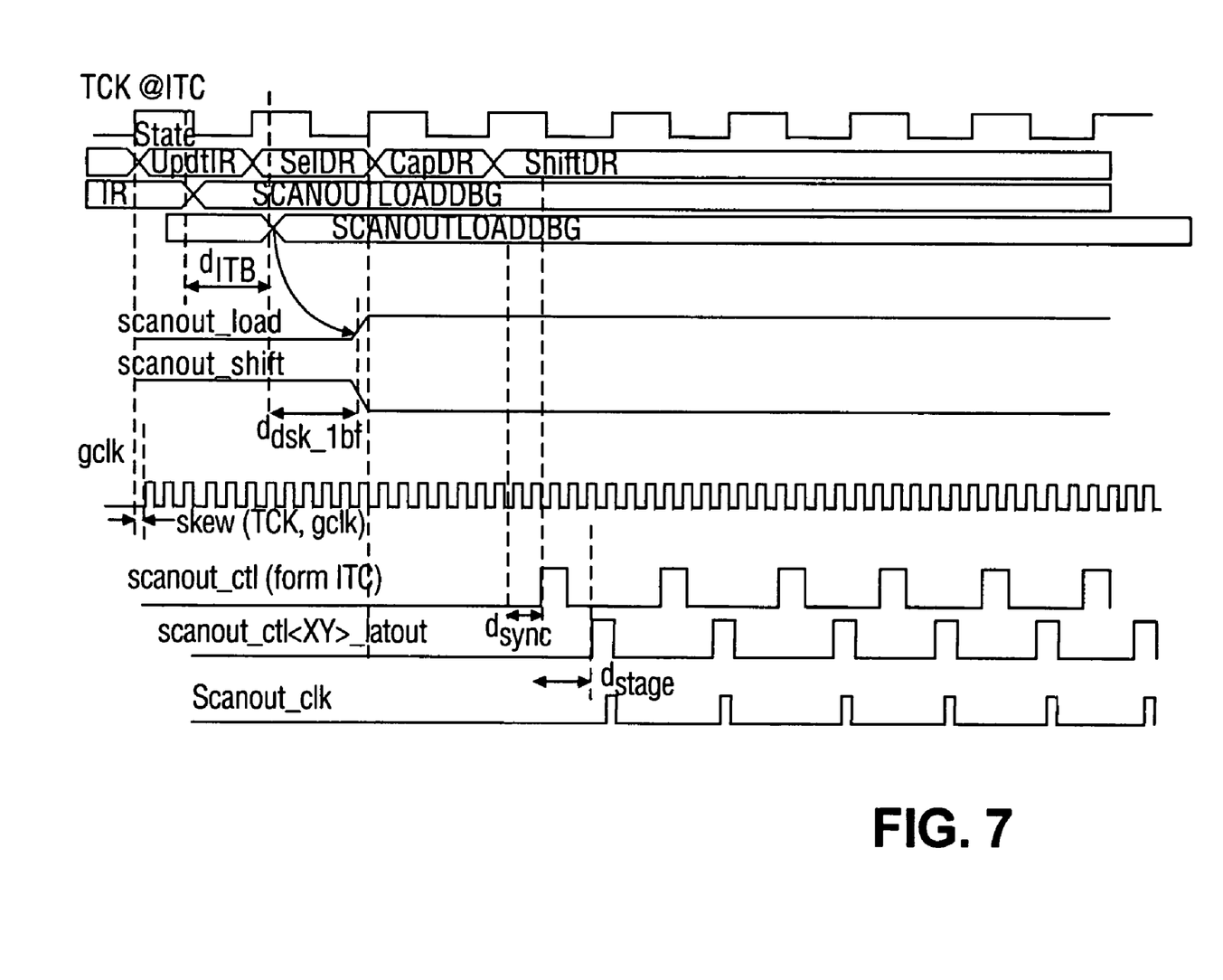
FIG. 7 illustrates scanout clock waveforms for shifting a scanout chain.
Figure 8:
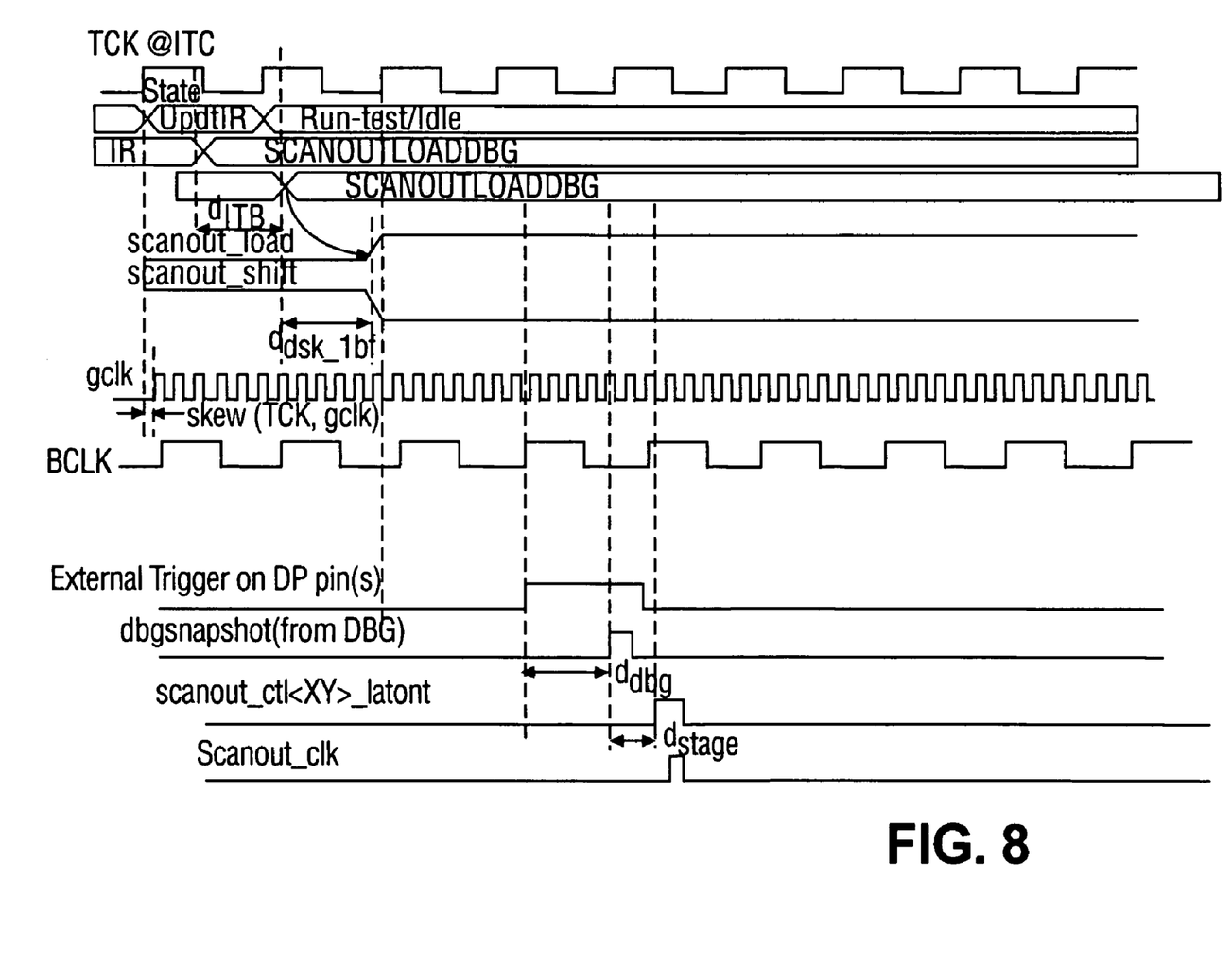
FIG. 8 illustrates scanout clock waveforms for a snapshot on an external trigger.

When SCANOUTLOAD is loaded, the trigger input is provided by a low-to-high transition on the TDI pin. This provides an additional model of snapshot that is a failsafe option and is independent of the DBG. FIG. 7 illustrates scanout clock waveforms for shifting a scanout chain (one shift per clock). FIG. 8 illustrates scanout clock waveforms for a snapshot on an external trigger.

The distributed test control scheme in one embodiment of the invention works towards reducing the number of global test control lines, relaxes routing constraints on the test control lines, and adds greater flexibility in the physical placement of the test controller and test control logic. This translates to lower silicon area and reduced design effort (cost, efficiency, quality, reliability, and timeliness). Moreover, the distributed test control scheme of the invention is scalable and flexible; that is to say, the distributed test control scheme may include the ability to add support for new test features late in the design cycle and implement fixes with relatively small impact on schedule.

The above embodiments can also be stored on a device or medium and read by a machine to perform instructions. The device or medium may include a solid state memory device and/or a rotating magnetic or optical disk. The device or medium may be distributed when partitions of instructions have been separated into different machines, such as across an interconnection of computers.

The exemplary embodiments described herein are provided merely to illustrate the principles of the invention and should not be construed as limiting the scope of the subject matter of the terms of the claimed invention. The specification and drawings are, accordingly, to be regarded in an illustrative rather than a restrictive sense. Moreover, the principles of the invention may be applied to achieve the advantages described herein and to achieve other advantages or to satisfy other objectives, as well.

What is claimed is:

1. An apparatus comprising:
   an internal test bus (ITB);
   a plurality of deskew clusters coupled to the ITB, wherein the plurality of deskew clusters each include a deskew controller;
   an integrated test controller (ITC) coupled to the ITB, said ITC having an instruction register and a test access port finite state machine (TAP FSM); and
   a debug unit coupled to the ITC, said debug unit triggers a signal as an input to said ITC in response to an externally generated test signal;
   wherein the ITC only generates a single global control signal and each of the deskew controllers generates a first local control signal and a second local control signal in response to the single global control signal, where said ITC encodes and transmits states of said TAP FSM and test instructions to at least one logic unit controller over said ITB to test said apparatus, wherein a snapshot instruction and a shift instruction are transmitted in the single global control signal together and are partitioned into separate operations and it is not necessary to synchronize the snapshot instruction and the shift instruction.

2. The apparatus of claim 1, wherein each of the plurality of deskew clusters further comprise a plurality of deskew buffers and a regional clock driver (RCD).

3. The apparatus of claim 1, wherein the single global control signal and one of the first local control signal, the second local control signal, and both the first local control signal and the second local control signal provide a distributed test control scheme for integrated circuits including debug and testability operations.

4. The apparatus of claim 1, wherein the first local control signal is a snapshot instruction and the second local control signal is a shift instruction.

5. The apparatus of claim 4, wherein a snapshot instruction can be issued at a first time period and a shift instruction can be issued at a second time period, and results from the snapshot instruction can be shifted by the shift instruction after a third period of time.

6. A method comprising:
   generating a single global control signal in an integrated test controller within an integrated circuit in response to an external signal;
   decoding the single global control signal in a deskew controller in the integrated circuit;
   generating a first local control signal corresponding to the single global control signal;
   distributing the first local control signal to a regional clock driver (RCD); and
   performing one of a debug operation and a testability operation on the integrated circuit by using the single global control signal and the first local control signal, where a snapshot instruction and a shift instruction are transmitted in the single global control signal together and are partitioned into separate operations and it is not necessary to synchronize the snapshot instruction and the shift instruction.

7. The method of claim 6, further comprising generating a second local control signal corresponding to the single global control signal.

8. The method of claim 7, wherein one of the first local control signal is a snapshot instruction and the second local control signal is a shift instruction.

9. The method of claim 8, further comprising issuing a snapshot instruction at a first time period;
issuing a shift instruction at a second time period; and shifting results from the snapshot instruction by the shift instruction after a third period of time.

10. The method of claim 6, further comprising triggering the debug operation after a variable time period.

11. A program storage device readable by a machine comprising instructions that cause the machine to:
generate a single global control signal in an integrated test controller within an integrated circuit;
decode the single global control signal in a deskew controller within the integrated circuit;
generate a first local control signal corresponding to the single global control signal;
distribute the first local control signal to a regional clock driver (RCD); and
perform one of a debug operation and a testability operation on the integrated circuit by using the single global control signal and the first local control signal, wherein a snapshot instruction and a shift instruction are transmitted in the single global control signal together and are partitioned into separate operations and it is not necessary to synchronize the snapshot instruction and the shift instruction.

12. The program storage device of claim 11, wherein the instructions further cause the machine to:
generate a second local control signal corresponding to the single global control signal.

13. The program storage device of claim 12, wherein the first local control signal is a snapshot operation and the second local control signal is a shift operation.

14. The program storage device of claim 13, wherein the instructions further cause the machine to: issue a snapshot operation at a first time period;
issue a shift operation at a second time period; and shift results from the snapshot operation by the shift operation after a third period of time.

15. The program storage device of claim 11, the instructions further cause the machine to: trigger the debug operation after a variable time period.

16. A system comprising:
at least one processor;
a global bus coupled to the at least one processor;
a memory coupled to the global bus;
an internal test bus (ITB) located within the at least one processor;
a plurality of deskew clusters coupled to the ITB, wherein the plurality of deskew clusters each include a deskew controller;
an integrated test controller (ITC) coupled to the LTB; and
a debug unit coupled to the ITC;
wherein the ITC only generates a single global control signal and each of the deskew controllers generates a first local control signal in response to the single global control signal to test the at least one processor, wherein a snapshot instruction and a shift instruction are transmitted together in the single global control signal and are partitioned into separate operations, and it is not necessary to synchronize the snapshot instruction and the shift instruction.

17. The system of claim 16, wherein each of the plurality of deskew clusters further comprise a plurality of deskew buffers and a regional clock driver (RCD).

18. The system of claim 16, wherein each of the deskew controllers further generates a second local control signal, wherein the single global control signal and one of the first local control signal, the second local control signal, and both the first local control signal and the second local control signal provide a distributed test control scheme for integrated circuits including debug and testability operations.

19. The system of claim 16, wherein the first local control signal is a snapshot instruction and the second local control signal is a shift instruction.

20. The system of claim 19, wherein a snapshot instruction can be issued at a first time period and a shift instruction can be issued at a second time period, and results from the snapshot instruction can be shifted by the shift instruction after a third period of time.

* * * * *

UNITED STATES PATENT AND TRADEMARK OFFICE
CERTIFICATE OF CORRECTION

PATENT NO. : 6,973,606 B2 Page 1 of 1
DATED : December 6, 2005
INVENTOR(S) : Mukherjee It is certified that error appears in the above-identified patent and that said Letters Patent is hereby corrected as shown below:

Column 10,
Line 10, delete "LTB;" and insert -- ITB; --.

Signed and Sealed this

Eighteenth Day of April, 2006

JON W. DUDAS
*Director of the United States Patent and Trademark Office*